United States Patent [19]

Fox

[11] 3,783,304

[45] Jan. 1, 1974

[54] CONSTANT PULSE WIDTH GENERATOR

[75] Inventor: Haydn Milton Fox, Delran, N.J.

[73] Assignee: RCA Corporation, New York, N.Y.

[22] Filed: Dec. 22, 1972

[21] Appl. No.: 317,741

[52] U.S. Cl. .................. 307/106, 328/58, 332/9 T, 325/142

[51] Int. Cl. .......................... H03k 3/00, H03k 3/64

[58] Field of Search .................... 307/106, 108, 266; 328/58; 325/142; 332/9 R, 9 T

[56] References Cited

UNITED STATES PATENTS

| | | | |
|---|---|---|---|
| 3,693,113 | 9/1972 | Glasser | 328/58 |
| 3,073,971 | 1/1963 | Daigle, Jr. | 328/58 |

*Primary Examiner*—David Smith, Jr.
*Attorney*—Edward J. Norton

[57] ABSTRACT

A generator useful as the output pulse generator in a serrasoid modulator provides a constant pulse width output regardless of input pulse amplitude or width variations. The pulse generator includes a differential amplifier wherein input signals through a first input coupling circuit to one terminal of the differential amplifier are integrated and the input signals through a second input coupling circuit to the second terminal are coupled without appreciable integration. A fixed D.C. offset voltage between the two inputs is achieved by a constant current source coupled to a resistor in the second input coupling circuit.

4 Claims, 4 Drawing Figures

CONSTANT PULSE WIDTH GENERATOR

BACKGROUND OF THE INVENTION

This invention relates to a pulse generator circuit and more particularly to a generator circuit which in response to an input pulse produces an output pulse of constant width regardless of amplitude or width variations of the input pulse. This type of pulse generator is particularly useful in serrasoid type modulators wherein pulses of varying pulse position only are desired to provide a phase modulated wave which is free from unwanted amplitude modulation.

Basically, a serrasoid modulator includes a first portion which generates a sawtooth wave at the carrier frequency rate. This sawtooth wave is then compared with a modulating signal at a second comparator portion. When the amplitude of the sawtooth wave exceeds that of the modulating signal, the output level from the comparator rises. When the sawtooth waveform voltage decreases sharply below the modulating signal level, the output level from the comparator drops. The result is a variable pulse width and pulse position signal from the comparator which is dependent upon the relative amplitudes of the sawtooth wave and the modulating signal. The output from the comparator is then coupled to a pulse width generator portion which in order to prevent amplitude distortion in the modulator output requires that the pulse widths all be equalized without distorting the pulse position.

Serrasoid type modulators are presently being used in mobile radio transmitters. This was made possible by integrated circuit technology which permits this more complex type of modulator to come into use at low cost. In the presently available type of serrasoid modulators, the pulse generation following the comparison is conventionally accomplished using a differential amplifier. For example, see the bottom half of FIG. 3 in U.S. Pat. No. 3,614,470. The two inputs are shaped differently (pre-emphasis and de-emphasis) and a D.C. offset voltage is provided by a voltage divider. A pulse is triggered when one of the inputs to the differential amplifier exceeds the voltage at the other terminal. A similar pulse timing circuit with an integrator input to one terminal and a D.C. offset at the opposite terminal is shown and described by Jenkins U.S. Pat. No. 3,073,972. In these prior art arrangements, the D.C. offset is provided by simple voltage dividers. If the amplitude of the input signal should vary in the above arrangements such as by power supply variations or by beta changes in the previous transistor stages with temperature changes, the D.C. offset voltage changes and consequently the resultant pulse width varies. This introduces unwanted amplitude modulation in the phase modulated output signal.

Serrasoid type modulation has heretofore not been used in arrangements such as hand-held portable radios. Since the battery voltages and the operating temperatures vary considerably and regulated power supplies for the total supply source cause too much power loss, it is easily seen in view of the above discussion that such prior art pulse generators used in hand-held portable radios for example, would suffer from a varying offset voltage and unwanted amplitude modulation.

BRIEF DESCRIPTION OF THE INVENTION

Briefly, there is provided a differential amplifier having two inputs and an output. A first input coupling circuit couples an input signal with a selected distortion to a first input terminal of the differential amplifier. A second input coupling circuit couples the input signal without such selected distortion to a second input terminal of the differential amplifier. At least one of the coupling circuits includes a series resistor. A constant current source is coupled between the series resistor in one of the coupling means and the input of the differential amplifier for providing a constant D.C. current through the series resistor to provide a negative offset voltage at one of the input terminals which is of a fixed offset potential with respect to the other input terminal regardless of the input signal pulse width or amplitude.

A more detailed description of the invention follows in conjunction with the following drawings wherein.

DETAILED DESCRIPTION

Figure 1:
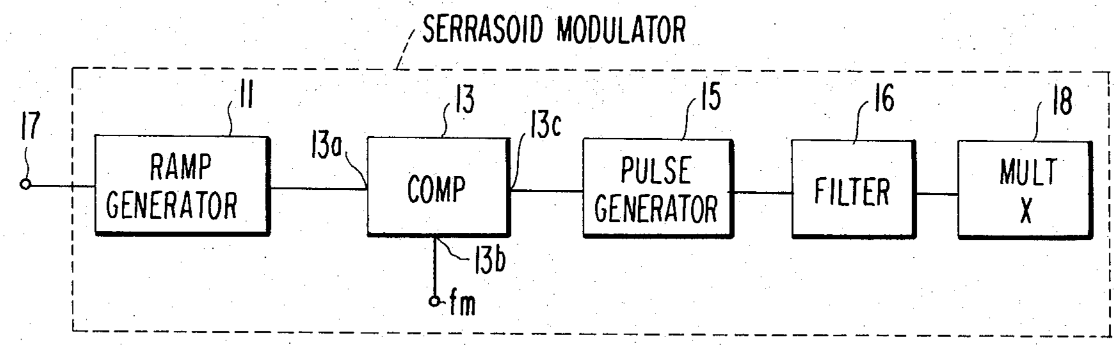
FIG. 1 is a block diagram of a serrasoid modulator.
Figure 2:
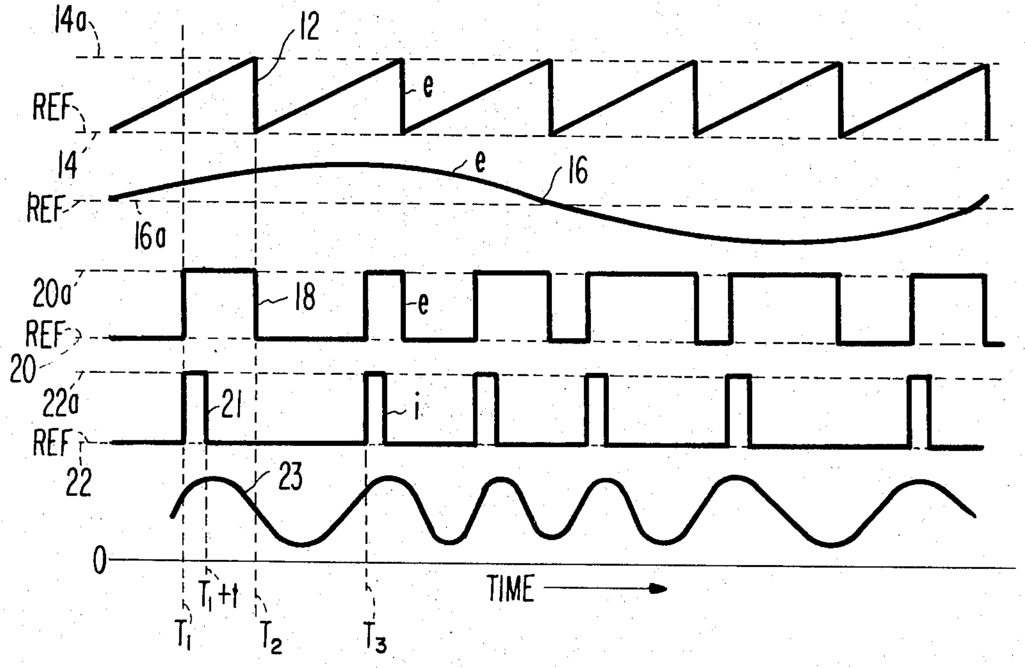
FIG. 2 is a series of waveforms used in illustrating serrasoid operation.

A serrasoid modulator as shown in FIG. 1 includes a ramp generator 11, a comparator 13 and a pulse generator 15. Additionally the modulator may include a filter 16 and multiplier 18. In response to carrier frequency signals $f_c$ at the input terminal 17 of ramp generator 11, a series of sawtooth waves as illustrated by waveform 12 of FIG. 2 is provided. In considering the waveform 12, the amplitude of the wave increases from reference level 14 to a point at reference level 14*a* above level 14 where at time $T_2$ the ramped output drops suddenly back to reference potential 14. In a typical serrasoid modulator, this return of the ramp back to the reference potential occurs at the carrier frequency signal rate. This can be accomplished by charging a capacitor, not shown, and discharging the capacitor once every positive cycle of the carrier wave. The sawtooth waveform output from ramp generator 11 is coupled to a first terminal 13*a* of comparator 13. The modulating signal ($f_m$) is coupled to a second terminal 13*b* of comparator 13. Waveform 16 in FIG. 2 illustrates a modulating signal in the form of a sine wave. As in a typical sine wave 16, the voltage of the wave is above the reference level 16 *a* for one-half the cycle and then is at a potential below the reference potential 16*a* the remaining half cycle. The reference potential 16*a* is made substantially above that of level 14 so that even when the waveform 16 is at its lowest point below the reference level 16*a*, that lowest potential remains above the reference potential 14 in waveform 12.

In the operation of the comparator 13, when the amplitude of the sawtooth ramp waveform 12 exceeds that of the modulating signal, the output level 13*c* from the comparator as indicated by waveform 18 increases from reference level 20 to level 20*a*. As shown in waveform 18 at time $T_1$, level 20*a* is above that of reference potential 20. At the time $T_2$ when the ramp signal associated with waveform 12 falls below the modulating signal level, the voltage output level of waveform 18 returns back to reference potential 20.

Waveform 18 dependent upon the modulating frequency includes pulses at varying time positions and varying pulse widths. These pulse width variations will produce unwanted amplitude modulation in the output. In order to achieve phase modulation without this amplitude distortion, the output 13$c$ from the comparator 13 is coupled to a pulse generator 15. The pulse generator 15 in response to the leading edge of each of the received pulses of varying pulse width produces a constant but varying pulse position signal as indicated by current waveform 21 of FIG. 2. The waveform 21 exhibits a current level initially at reference current level 22 that rises to a given amplitude level 22$a$ above reference current level when the waveform 18 rises above reference potential. This signal returns to the reference current at a fixed time t period following $T_1$. This occurs for each positive going pulse in waveform 18. The output from the pulse generator 15 is then coupled to a filter network 16 which may form part of the pulse generator 15 to produce a phase modulated carrier wave as indicated by waveform 23 of FIG. 2.

Figure 3:
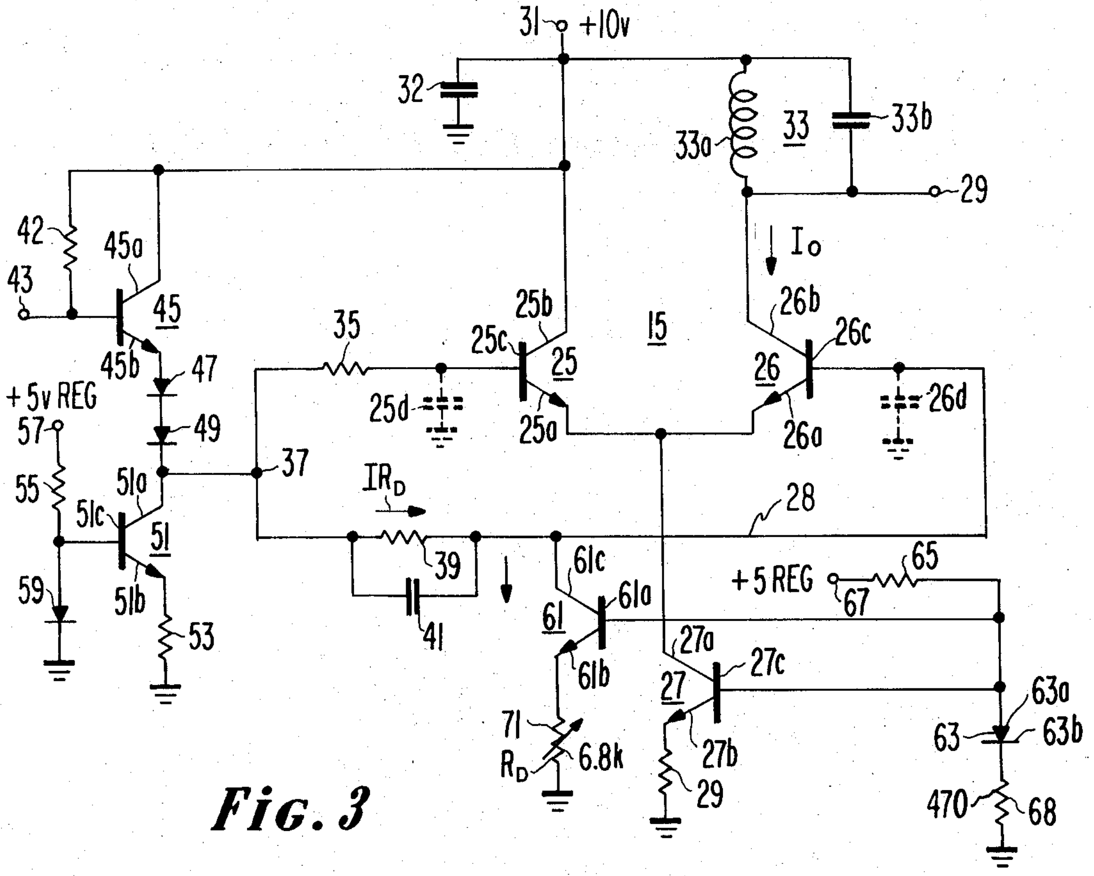
FIG. 3 is a schematic diagram of a pulse width generator.

The constant pulse width signal described above can be achieved by the pulse generator circuit of FIG. 3. The pulse generator 15 of FIG. 3 includes a pair of transistors 25 and 26 coupled as a differential pair. The emitters 25$a$ and 26$a$ of transistors 25 and 26 respectively are coupled to each other and to a constant current source including transistor 27, resistor 29, diode 63, resistor 68, resistor 65 and a regulated voltage source (not shown) connected at terminal 67. The collector 27$a$ of transistor 27 is coupled to the emitters 25$a$ and 26$a$, and the emitter 27$b$ of transistor 27 is coupled to ground or reference potential through resistor 29. The base 27$c$ is coupled to the anode 63$a$ of diode 63 and through resistor 65 to the +5 volt regulated voltage source at terminal 67. The cathode 63$b$ of diode 63 is coupled through resistor 68 to ground or reference potential. The collectors 25$b$ and 26$b$ of transistors 25 and 26 are coupled to a +10 volt unregulated voltage source at terminal 31. The capacitor 32 is the AC bypass from the power supply. The collector 26$b$ of transistor 26 is coupled via resonant circuit 33 to output terminal 29. The bases 25$c$ and 26$c$ are coupled to a common junction point 37 with base 25$c$ coupled through a resistor 35 and base 26$c$ coupled through a like valued resistor 39. A given base current $i_b$ flows through equal valued resistors 39 and 35. Resistor 39 is by-passed by capacitor 41.

The D.C. voltage at junction point 37 is controlled by transistor 45, diodes 47 and 49 and transistor 51. The collector 45$a$ of transistor 45 is coupled to terminal 31 and the emitter 45$b$ is coupled via the level shifting diodes 47 and 49 to junction point 37. Junction point 37 is coupled to collector 51$a$ of transistor 51. The emitter 51$b$ of transistor 51 is coupled via a resistor 53 to ground or reference potential. The base 51$c$ of transistor 51 is coupled via resistor 55 to a +5 volt regulated voltage source at terminal 57. Coupled between the base 51$c$ and ground reference potential is a diode 59. A constant current controlled by the diode 59 is provided by transistor 51.

Figure 4:
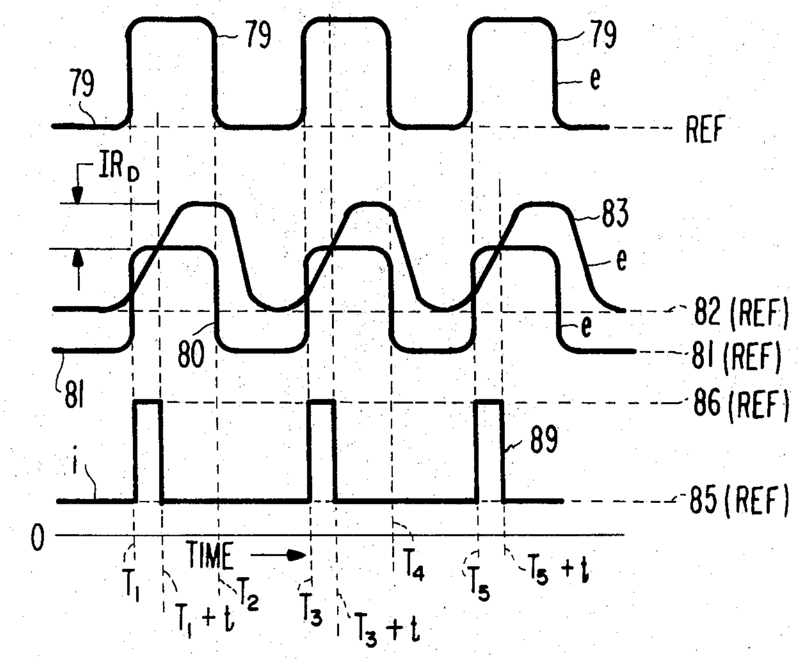
FIG. 4 is a series of the waveforms illustrating the operation of the pulse width generator of FIG. 3.

A constant current source is provided by transistor 61 having its base coupled to the anode 63$a$ of diode 63, its emitter coupled through $R_D$ resistor 71 to ground or reference potential, and its collector 61$c$ coupled to the lead 28 located between resistor 39 and base 26$c$ of transistor 26. Due to the resistance value differences between resistor 68 and resistor 71 (resistor 68 being, for example, 470 ohms when resistor 71 is 6.8 K ohms) only a small increment of D.C. current (in addition to normal base current $i_b$ through both resistors 35 and 39) is coupled through resistor 39, transistor 61 and the resistor 71. The $IR_D$ drop due to the constant current across resistor 39 produces a fixed D.C. offset level in waveform 80 as compared to waveform 83 as shown in FIG. 4 to be described so that the reference level 81 of waveform 80 is lower in amplitude than the reference level 82 associated with the waveform 83. Due to the effective A.C. signal decoupling between collector 61$c$ and base 61$a$ of transistor 61, this differential offset as selected is independent of the amplitudes of the pulses coupled to terminal 43.

In the operation of the circuit described in connection with FIGS. 3 and 4, varying pulse width signals from the comparator 13 are coupled to terminal 43 of transistor 45. These signals are level shifted by diodes 47 and 49 to a lower potential and applied to base 25$c$ of transistor 25 via resistor 35 and to the base 26$c$ of transistor 26. The incoming signal of waveform 79 at junction 37 is coupled without substantial distortion to the base 26$c$ of transistor 26 as indicated by waveform 80. The input waveform coupled to the base 25$c$ is integrated due to inherent base-emitter capacitance 25$d$ (indicated by dashed lines) acting with the resistor 35. The result is the waveform 83 with a ramp signal at the leading edge of each pulse, the amplitude of the peak of each ramp exceeding the peak amplitude of each pulse in waveform 80 at the base 26$c$ due to the D.C. offset. The inherent base-to-emitter capacitance 26$d$ of transistor 26 has negligible effect in the input to transistor 26 due to the addition of a speed-up capacitor 41 coupled across the resistor 39. The resultant waveform shape at the base 26$c$ therefore follows input waveform 79. The compared current output at collector 26$b$ is shown in waveform 89 with a signal which goes from a reference current level at level 85 (zero) to a more positive current level 86 when the level of waveform 80 exceeds the level of waveform 83 at time $T_1$. When the level of waveform 83 at time $T_1 + t$ exceeds that of waveform 80, transistor 26 is biased off and transistor 25 is biased on and the current output level returns to the reference level 85. The time period between $T_1$ and $T_1 + t$ is always constant and independent of the signal amplitude level at terminal 43 due to the constant current source provided by the circuit including transistor 61. The output pulse width can be changed by changing the value of resistor 71 and consequently changing the amount of fixed current through resistor 39 and consequently the offset due to the $IR_D$ voltage drop across resistor 39.

The constant pulse width and varying pulse position signal of waveform 89 is coupled at collector 26$b$ to the filter 33. The values of inductor 33$a$ and capacitor 33$b$ are selected to couple at the output terminal 29 a sine wave representation of the varying pulse position signal at collector 26$b$ which is at the carrier frequency or selected harmonic thereof.

Although in the particular example regulated power sources are described, these regulators are assumed to be at a current level below that of the main power source and therefore this circuit has decreased power loss. There may be even further reduced power loss by replacing the type of constant current sources shown including regulated power supply by constant current sources using saturated FET stages, for example.

What is claimed is:

1. A pulse generator for providing output pulses of substantially constant width in response to input pulses of variable width and amplitude comprising:

a signal input terminal adapted to receive said input pulses;

a differential amplifier having two inputs and an output;

a first coupling means located between said signal input terminal and a first of said inputs of said differential amplifier;

a second coupling means including a series resistor located between said signal input terminal and the second input terminal of said differential amplifier;

a constant current source coupled to said second coupling means between said resistor and said second input terminal to provide a constant D.C. current through said series resistor causing an offset voltage of a given potential at said second input terminal of said differential amplifier, with said offset being independent of said input pulse width or amplitude, so that said input pulses as received at said first amplifier input are distorted in a given sense but as received at said second amplifier input are without said distortion;

said differential amplifier providing an output pulse of given width when the amplitude level at a selected one of the amplifier inputs exceeds the amplitude level at a non-selected one of said amplifier inputs.

2. A pulse generator for providing an output pulse signal of substantially constant pulse width in response to an input pulse signal of variable pulse width and amplitude comprising:

a signal input terminal adapted to receive said input pulse signal;

a differential amplifier having two inputs and an output;

a first series resistor coupled by a first coupling means between said signal input terminal and a first of said inputs of said differential amplifier responsive to said input pulse signal to convert said input pulse signal to integrated signals of a given slope;

a second resistor and a bypass capacitor coupled across said second resistor to form a resistor-capacitor network;

said resistor-capacitor network coupled in series by a second coupling means between said signal input terminal and the second input terminal of said differential amplifier responsive to said input pulse signal to pass said input pulse signal without any substantial integration;

a constant current source included in said second coupling means at a point between said second resistor and said second input terminal of said differential amplifier for providing a constant current through said second resistor causing an offset voltage of a given potential at said second input terminal with the offset voltage being independent of the input signal pulse width or amplitude;

said differential amplifier providing an output pulse of given width when the amplitude level at a selected one of the amplifier inputs exceeds the amplitude level at a non-selected one of said amplifier inputs.

3. The combination claimed in claim 2 wherein said first and second series resistors are of equal value.

4. In a generator of phase modulated signals of the type including a source of sawtooth waves of substantially constant frequency, a source of modulating signals, at least one wave shape modifying means responsive to the modulating signals and said sawtooth waves and arranged to convert said sawtooth waves to rectangular waves whose width and position are directly proportional to the instantaneous magnitude of said modulating signals and wherein said rectangular waves due to changes in the operating characteristics of said generator are of varying amplitude resulting in unwanted amplitude modulation in the phase modulated signal, the improvement therewith for providing substantially constant pulse width signals of a pulse position directly proportional to the instantaneous magnitude of said modulating signals regardless of the amplitude and pulse width of said rectangular waves comprising, in combination;

a differential amplifier having two inputs and an output;

a first series resistor coupled by a first coupling means between said wave shape modifying means and a first of said inputs of said differential amplifier responsive to said rectangular waves for coupling integrated waves of a given slope at the first input terminal of said amplifier;

a second series resistor and a bypass capacitor coupled across said second resistor forming a resistor-capacitor network, said resistor-capacitor network coupled in series by a second coupling means between said wave shape modifying means and the second input terminal of said differential amplifier responsive to said rectangular waves for coupling said rectangular waves without substantial integration at the second input terminal of said amplifier;

a constant current source included in said second coupling means between said second resistor and said second input terminal of said differential amplifier for providing a constant D.C. current through said second resistor causing an offset voltage of a given potential at said second input terminal with said offset being independent of the pulse width or amplitude of said rectangular waves;

said differential amplifier providing an output pulse of given width when the amplitude level at a selected one of the two amplifier inputs exceeds the amplitude level at a non-selected one of said amplifier inputs.

* * * * *